United States Patent
Laverdiere et al.

(10) Patent No.: US 8,082,066 B2
(45) Date of Patent: Dec. 20, 2011

(54) SYSTEM FOR CONTROLLING VALVE FLUID FLOW BASED ON RATE OF CHANGE OF CLOSE RATE ACCELERATION

(75) Inventors: Marc Laverdiere, Wakefield, MA (US); Robert F McLoughlin, Pelham, NH (US)

(73) Assignee: Entegris, Inc., Billerica, MA (US)

( * ) Notice: Subject to any disclaimer, the term of this patent is extended or adjusted under 35 U.S.C. 154(b) by 401 days.

(21) Appl. No.: 11/937,931

(22) Filed: Nov. 9, 2007

(65) Prior Publication Data

US 2008/0071425 A1 Mar. 20, 2008

Related U.S. Application Data

(60) Division of application No. 11/502,048, filed on Aug. 10, 2006, now Pat. No. 7,317,971, which is a continuation of application No. 10/779,009, filed on Feb. 13, 2004, now Pat. No. 7,107,128.

(51) Int. Cl.
*G05D 7/00* (2006.01)
*G05D 7/06* (2006.01)

(52) U.S. Cl. .......................... 700/283; 700/282; 137/48

(58) Field of Classification Search .................. 700/282, 700/283; 137/48
See application file for complete search history.

(56) References Cited

U.S. PATENT DOCUMENTS

| 5,964,192 A | 10/1999 | Ishii |
| 6,113,695 A | 9/2000 | Fujimoto |
| 6,176,438 B1 | 1/2001 | Sato |
| 6,200,100 B1 | 3/2001 | Yang |
| 6,348,098 B1 | 2/2002 | McLoughlin |
| 6,973,375 B2 | 12/2005 | Brodeur et al. |
| 7,107,128 B2 * | 9/2006 | Laverdiere et al. ........... 700/282 |
| 7,317,971 B2 * | 1/2008 | Laverdiere et al. ........... 700/282 |
| 2001/0035512 A1 | 11/2001 | Messer |
| 2002/0139949 A1 | 10/2002 | Quarre |
| 2002/0153427 A1 * | 10/2002 | Shyu ............................... 239/11 |

FOREIGN PATENT DOCUMENTS

JP 2000-161514 6/2000

OTHER PUBLICATIONS

Office Action issued U.S. Appl. No. 10/779,009, mailed Sep. 22, 2005, 13 pgs.
Office Action issued U.S. Appl. No. 10/779,009, mailed Jan. 20, 2006, 16 pgs.
Office Action issued U.S. Appl. No. 11/502,048, mailed Nov. 16, 2006, 21 pgs.
International Search Report and Written Opinion for International Patent Application No. PCT/US2005/003709, mailed Nov. 20, 2006, 11 pgs.

(Continued)

*Primary Examiner* — Ryan Jarrett
(74) *Attorney, Agent, or Firm* — Sprinkle IP Law Group

(57) ABSTRACT

Embodiments of the present invention provide systems and methods of controlling fluid dispense to ensure clean break off of fluid at the end of a dispense process and to reduce crystallization of fluid in the dispense nozzle. One embodiment of the present invention can include a controller that can, generate a flow control signal to cause a control valve to close according to a first close rate parameter for a first segment of the close range and to generate the flow control signal to cause the control valve to close according to a second close rate parameter for a second segment of the close range.

13 Claims, 7 Drawing Sheets

OTHER PUBLICATIONS

Office Action issued U.S. Appl. No. 11/502,048, mailed Apr. 26, 2007, 25 pgs.

Japanese Office Action and English Translation issued in Japanese Patent Application No. 2006-553171, issued on Oct. 12, 2010, mailed Oct. 14, 2010, 5 pgs.

Office Action issued for Korean Patent Application No. 10-2006-7015651, mailed Apr. 13, 2011, 8 pgs.

Office Action issued for TaiwanPatent Application No. 094104062, mailed May 5, 2011, 13 pgs.

* cited by examiner

SYSTEM FOR CONTROLLING VALVE FLUID FLOW BASED ON RATE OF CHANGE OF CLOSE RATE ACCELERATION

CROSS-REFERENCE TO RELATED APPLICATIONS

This application is a divisional of, and claims a benefit of priority under 35 U.S.C. 120 of the filing date of U.S. patent application Ser. No. 11/502,048 by inventors Marc Layerdiere and Robert F. McLoughlin entitled "System for Controlling Fluid Flow Based on a Valve Break Point" filed on Aug. 10, 2006, which in turn is a continuation of U.S. patent application Ser. No. 10/779,009 filed Feb. 13, 2004 by inventors Marc Layerdiere and Robert F. McLoughlin entitled "System for Controlling Fluid Flow", now U.S. Pat. No. 7,107,128, the entire contents of which are hereby expressly incorporated by reference for all purposes.

TECHNICAL FIELD

The present invention relates generally to the field of dispensing fluids. More particularly, the present invention relates to systems and methods of controlling fluid flow at the end of a dispense process.

BACKGROUND

The manufacture of semiconductors often requires dispensing various liquids on a silicon wafer. In Spin-On Glass ("SOG") methods, a SOG material, typically a silicon dioxide solution, is dispensed by a nozzle onto the center of a silicon wafer. The wafer is then immediately rotated at a high speed, spreading the SOG material across the wafer. The amount of SOG material dispensed, surface tension of the SOG material solution, viscosity of the SOG material solution, the oxide concentration of the SOG material and the spin rate of the wafer affect the resulting film thickness.

In many semiconductor manufacturing systems, pumps and valves are used to control the amount of liquid dispensed from the nozzle. During the dispense process, a controller determines how much liquid has been dispensed based on the flow rate of the liquid and the amount of time the dispense process has been ongoing. When the appropriate amount of liquid has been dispensed, the controller can signal a control valve upstream of the nozzle to close, cutting off fluid flow to the nozzle. A suckback valve, also located upstream of the nozzle, can draw fluid remaining in the nozzle out of the nozzle.

In order to achieve proper uniformity of a SOG material layer across a wafer, the fluid must break off cleanly with no droplets hitting the wafer after the end of the dispense process. Many semiconductor manufacturing systems use open/close pneumatic valves to terminate a dispense process. An open/close valve will typically close with a single speed more quickly than desired to produce a clean break off. In other words, an open/close valve will typically slam shut when the controller signals the end of the dispense process. This can cause the fluid to severely oscillate at the end of the dispense process, potentially causing droplets or excess fluid to drip onto the wafer, thereby affecting the uniformity of film thickness on the wafer.

One solution that has been developed for this problem has been to employ proportional valves in which the rate of change of closure (i.e., the acceleration) can be set to a predefined value, such that the valve can close more slowly than "slamming shut." One example of such a valve is a pneumatic control valve that uses a needle valve to control the pressure at the pneumatic control valve. Based on the state of the needle valve, the rate of closure of the pneumatic control valve is controlled. In these systems, a particular acceleration is selected and applied to the control valve such that rate of change of closure is substantially constant as the valve closes. While such systems can reduce droplets of excess fluid at the end of the dispense process, they can still allow some excess fluid to be deposited on the wafer.

Whether an open/close valve or proportional valve with predetermined rate of closure is employed, prior art semiconductor manufacturing systems suffer a further deficiency. After the control valve closes, a suckback valve is engaged that pulls remaining fluid up into the dispense nozzle. Drawing the fluid back into the nozzle too quickly can leave droplets in the nozzle. These droplets can crystallize, leading to problems in the next dispense process.

SUMMARY

Embodiments of the present invention provide a system and method of controlling fluid flow that eliminates, or at least substantially reduces, the shortcomings of prior art fluid flow control systems and methods.

One embodiment of the present invention can include a controller that further comprises a processor, a computer readable memory and a set of computer instructions stored on the computer readable memory. The computer instructions can be executable by the processor to generate a flow control signal to close a fluid control valve based on a first close rate parameter for a first segment of a close range and generate a flow control signal to close a fluid control valve based on a second close rate parameter for a second segment of the close range.

Another embodiment of the present invention can include a computer program product comprising a set of computer instructions stored on a computer readable memory. The set of computer instructions can comprise instructions executable to generate a flow control signal to close a fluid control valve based on a first close rate parameter for a first segment of the close range and to generate a flow control signal to close a fluid control valve based on a second close rate parameter for a second segment of the close range.

Yet another embodiment of the present invention can include a method of ending a dispense process comprising generating a flow control signal to close a fluid control valve based on a first close rate parameter for a first segment of a close range, determining that a second close rate parameter should apply and generating the flow control signal to close the fluid control valve based on the second close rate parameter for a second segment of the close range.

Yet another embodiment of the present invention can include a controller further comprising a processor, a computer readable memory and a set of computer instructions stored on the computer readable memory. The computer instructions can comprise instructions executable by the processor to determine that a fluid control valve has closed and to generate a suckback control signal configured to cause a suckback valve to push a fluid to the end of a nozzle.

Yet another embodiment of the present invention can comprise a computer program product comprising a set of computer instructions stored on a computer readable memory, executable by a computer processor, wherein the set of computer instructions comprise instructions executable to determine that a fluid control valve has closed and generate a suckback control signal configured to cause a suckback valve to push a fluid to the end of a nozzle.

Yet another embodiment of the present invention can include a method for a dispense process comprising determining that a fluid control valve has closed and generating a suckback control signal configured to cause a suckback valve to push a fluid to the end of a nozzle.

Embodiments of the present invention provide an advantage over prior art systems and methods of ending dispense processes by closing a fluid control valve in such a manner that the likelihood that excess fluid drops will hit a wafer after the end of the dispense process is reduced.

Embodiments of the present invention provide yet another advantage by reducing the crystallization of fluid droplets in a dispense nozzle after the dispense process has ended.

Embodiments of the present invention provide another advantage by enabling a user to employ any number of techniques using the same set of computer instructions to resolve close control issues for any number of applications, including different flow rates, dispense system setups and dispense fluids.

BRIEF DESCRIPTION OF THE FIGURES

A more complete understanding of the present invention and the advantages thereof may be acquired by referring to the following description, taken in conjunction with the accompanying drawings in which like reference numbers indicate like features and wherein.

DETAILED DESCRIPTION

Preferred embodiments of the invention are illustrated in the FIGURES, like numerals being used to refer to like and corresponding parts of the various drawings.

Embodiments of the present invention provide systems and methods of controlling fluid dispense to ensure clean break off of fluid at the end of a dispense process and to reduce crystallization of fluid in the dispense nozzle. One embodiment of the present invention can include a controller that can generate a flow control signal according to a first close rate parameter to cause a control valve to close for a first segment of the close range and to generate the flow control signal according to a second close rate parameter to cause the control valve to close for a second segment of the close range. The close rate parameter can result in closing the valve at a controlled rate, change in rate, or change in rate of change. By adjusting the close rate parameters, severe oscillation at the end of the dispense process can be reduced or prevented. Additionally, the controller can generate a suckback control signal to cause a suckback valve to push fluid to the end of a nozzle, draw fluid up into the nozzle or assist in cutting of the dispense more smoothly or more quickly. Because fluid is pushed to the end of the nozzle, the fluid can absorb droplets remaining in the nozzle.

Figure 1:
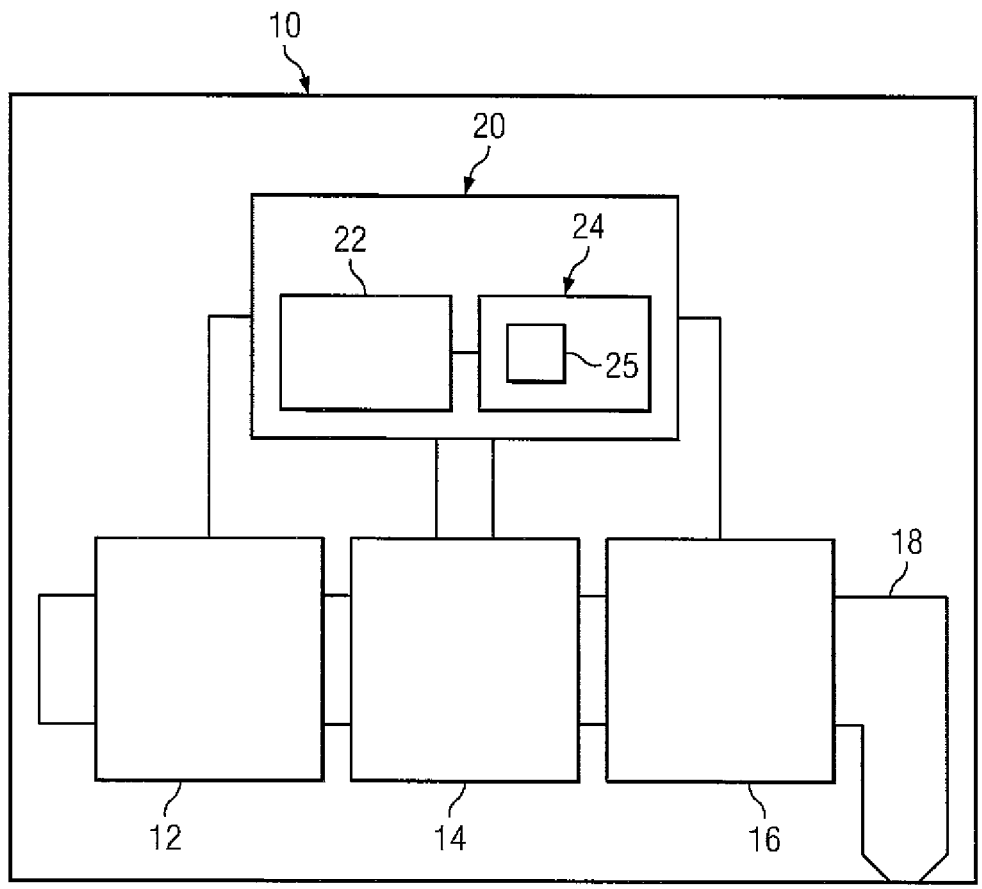
FIG. 1 is a diagrammatic representation of one embodiment of a fluid dispense system in which embodiments of the present invention can be implemented.

FIG. 1 is a diagrammatic representation of one embodiment of a fluid dispense system 10. Fluid dispense system 10 can include a fluid control device 12, flow monitor 14 in fluid communication with control device 12, a suckback device 16 in fluid communication with flow monitor 14, and a nozzle 18 in fluid communication with suckback valve 16. The outlet of suckback valve 16 can lead to nozzle 18 for dispensing a liquid to a wafer or other object. A controller 20 can be coupled to flow rate monitor 14, fluid control device 12 and suckback device 16 by one or more signal lines.

According to one embodiment of the present invention, fluid control device 12 can include any proportional control valve. In other words, fluid control device 12 can include any fluid control valve in which the rate of closure can change based on changes in the flow control signal applied. One embodiment of a proportional fluid control device is described in PCT application PCT/US03/22579, entitled "Liquid Flow Controller and Precision Dispense Apparatus and System," (the "Liquid Flow Controller Application") filed Jul. 18, 2003, which claims priority of Provisional Application Ser. No. 60/397,053 filed Jul. 19, 2002, entitled "Liquid Flow Controller and Precision Dispense Apparatus and System" and is related to U.S. Pat. No. 6,348,098, entitled "Flow Controller," filed Jan. 20, 2000 and Provisional Application Ser. No. 60/397,162, entitled "Fluid Flow Measuring and Proportional Fluid Flow Control Device", filed Jul. 19, 2002, each of which is fully incorporated by reference herein. In the embodiment of the Liquid Flow Controller Application, the fluid control device, as described in conjunction with FIG. 3, can include a fluid control valve that regulates fluid flow and a proportional pneumatic control valve that regulates how quickly and how much the fluid control valve opens or closes.

During a dispense process, a fluid such as a Spin-On glass fluid, deionized water, photoresist, polyamide, developer, chemical mechanical polishing ("CMP") slurry or other fluid can flow through dispense system 10. Flow monitor 14 can measure fluid flow parameters that indicate flow rate (e.g., pressure differential across a restriction, pressure at a particular sensor or other parameter) and communicate the measurements to controller 20. Controller 20, according to one embodiment of the present invention, can calculate the flow rate of the fluid and, based on the flow rate of the fluid, the amount of time necessary for a predetermined amount of the fluid to be dispensed. At the end of the dispense process, as determined by controller 20, controller 20 can generate a flow control signal to cause fluid control device 12 to close.

Additionally, controller 20 can generate a suckback control signal to cause suckback device 16 to push fluid into nozzle 18 or draw fluid up nozzle 18. The controller can be configured to generate the suckback control such that the suckback valve can push fluid to the end of the nozzle and then draw the fluid slowly back into the nozzle. By drawing fluid back into the nozzle at the appropriate speed, residual fluid droplets in the nozzle can be prevented. Moreover, controller 20 can generate the suckback control signal to aid in ending the dispense process. In this embodiment of the present invention, the suckback device can be engage to begin sucking fluid up the nozzle if the fluid control device can not close quickly enough, thereby aiding in terminating fluid flow to the wafer.

Controller 20, according to one embodiment of the present invention, can comprise a processor 22 such as a general purpose processor (e.g., a 8051 processor by Intel Corporation of Santa Clara, Calif.), a RISC processor (e.g., a PIC 18c452 processor by Microchip Technologies of Chandler, Ariz.) or other processor, a computer readable memory 24 (e.g., RAM, ROM, magnetic storage, optical storage, Flash memory) accessible by the processor and computer instructions 25 stored on memory 24 that are executable by processor 22. According to one embodiment of the present invention, controller 20 can execute computer executable instructions 25 to generate the flow control signal based on a first close rate parameter to cause control device 12 to close with a first rate of change of closure over a first segment of the valve close range of the flow control device and to generate the flow control signal to based on a second close rate parameter to cause flow control device to close over a second segment of the valve close range. The controller can switch from generating the flow control signal based on the first close rate parameter to generating the flow control signal based on the second close rate parameter at a break point. Additionally, controller 20 can execute computer executable instructions 25 to generate the suckback control signal to cause suckback valve to push fluid into nozzle 18 or draw fluid up nozzle 18.

FIGS. 2A-2F are flow charts illustrating various modes of operation for a controller for generating the flow control signal and suckback control signal, according to embodiments of the present invention. FIG. 2G is a valve profile graph for an example valve closing according to an embodiment of the present invention. The processes of FIGS. 2A-2F can be implemented as computer executable instructions stored on a computer readable memory. For example, the processes of 2A-2F can be implemented as subroutines of a larger control program, portions of the same program, modules of a program or according to any suitable programming architecture as would be understood by those of ordinary skill in the art.

According to one embodiment of the present invention, when the controller running a control program determines that a dispense process should end, the controller can assert an interrupt and enter the end-of-dispense process. During the end-of-dispense process, the controller can generate a flow control signal to close the fluid control valve according to multiple close rate parameters and can generate the suckback control signal to cause fluid to be pushed into or drawn up a nozzle.

Figure 2A:
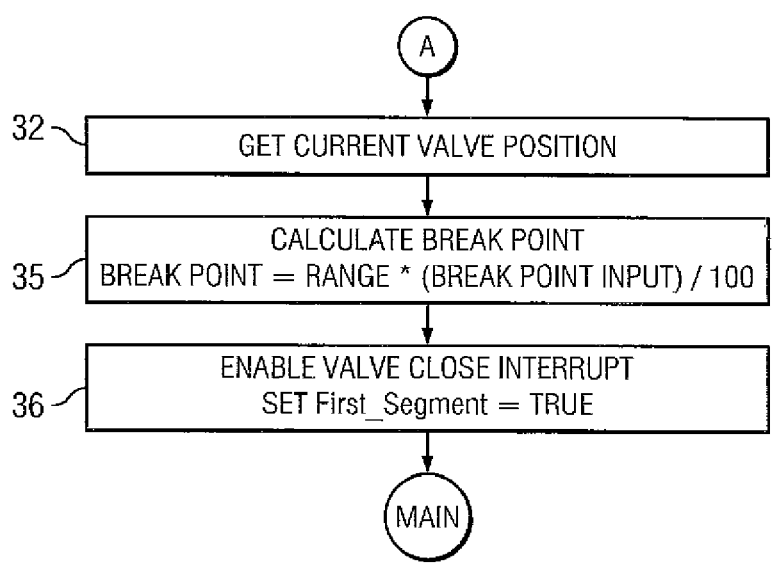
FIG. 2A illustrates one embodiment of an initial routine for an end-of-dispense process.

FIG. 2A illustrates one embodiment of an initial routine for an end-of-dispense process. At step 32, the controller can determine the current valve position for the fluid control valve. As would be understood by those of ordinary skill in the art, the current valve position will correspond to the valve position of the control valve during the dispense process and can be based on a setpoint (e.g., a flow rate set point) asserted to or stored by the controller for regulating the dispense process. At step 35, the controller can further calculate a valve close break point. As will be discussed below, the break point can correspond to the valve position at which the controller will switch between generating a flow control signal based on a first close rate parameter and generating the flow control signal based on a second close rate parameter. The valve break point can be based on the valve close range (the current valve position determined at step 32 minus the close or idle valve position) and a predefined break point parameter.

The break point parameter, in one embodiment of the present invention, can be a percentage of the valve close range. As example, if the current valve position is 100 units, the end point is 10 units and the break point parameter is 20, the break point range value will be at 18 units (0.20*90), relative to the valve end point. Since the end point for closing the valve is at 10 units, the break point can have a break point position value of 28 units. In other embodiments of the present invention, the break point can be a predefined value.

The controller, at step 36, can set a First_Segment Flag to True and return to a main control program to initiate a mode selection routine. The First_Segment Flag indicates that the fluid control valve is in the first segment of its close range. In other words, the First_Segement flag indicates whether the flow control valve has closed far enough to reach the break point.

Figure 2B:
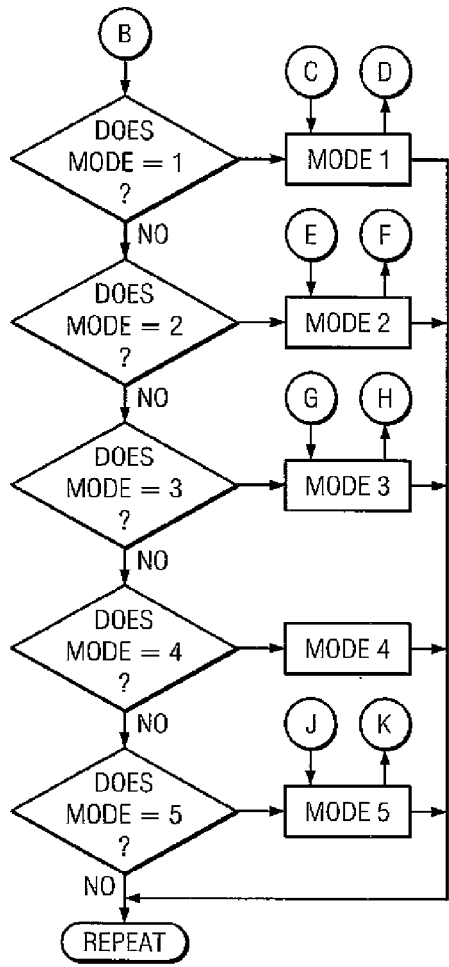
FIG. 2B illustrates a mode selection routine according to one embodiment of the present invention.

If the controller has multiple modes of operation for the end-of-dispense process, the controller can enter a mode selection routine, such as that illustrated in FIG. 2B. In the example of FIG. 2B, the controller has five modes of operation. The mode of operation for a particular dispense process can be predefined, can be asserted by an administrative system in communication with controller or can be established in any manner. In one embodiment of the present invention, the controller can repeat the process for a particular mode of operation until the fluid control valve is closed or until the end-of-dispense interrupt is no longer asserted.

Figure 2C:
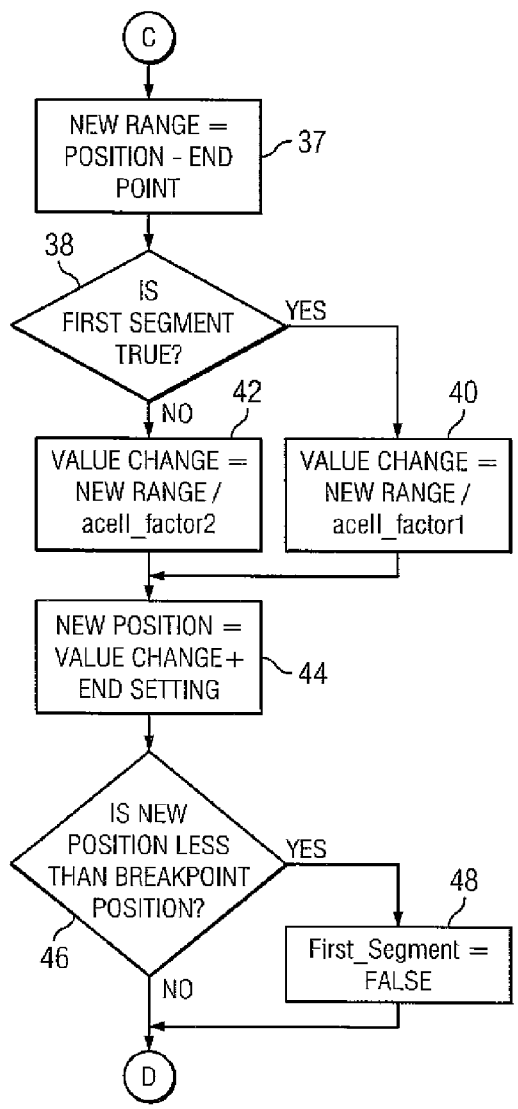
FIG. 2C illustrates a method for closing a fluid control valve according to one embodiment of the present invention.

FIG. 2C illustrates one embodiment of the operation of the controller under a first mode of operation (e.g., mode 1 from FIG. 2B). For purposes of FIGS. 2C-2F, the close rate parameter is an acceleration parameter that corresponds to the rate of change in the close rate acceleration. In the embodiment of FIG. 2C, the controller, at step 37, can determine a remaining close range for the valve. Continuing with the previous example in which the valve is initially at 100 units and has and endpoint of 10 units, the new range for the first iteration of mode 1 would be 90 units. In subsequent iterations, as will be discussed below, the remaining range can be equal to the value change calculated at step 40 or step 42 from a previous iteration or can be calculated based on a new valve position and the end point.

At step 38, the controller can determine if a First_Segment Flag is true and, if so, can generate the flow control signal based on a first acceleration factor. The value change (i.e., the difference between the end point and valve position at the end of the iteration) will be the range determined at step 37 divided by the first acceleration factor (step 40). Using the previous example, and assuming the first acceleration factor is 10, the value change for the first iteration is 9 (i.e., 90/10). If the First_Segment Flag is false, on the other hand, the controller can generate the flow control signal based on the second acceleration factor. In this case, the value change between the end point and the valve position will be the range determined at step 37 divided by the second acceleration factor (step 42).

The controller can determine the new valve position (step 44) based on the value change for the iteration (i.e., the value determined at step 40 or step 42) and the valve end point or idle position. Again, continuing with the previous example in which the idle position is 10 units and the value change 9, the new valve position is 19 units at the end of the first iteration.

At step 46, the controller can determine if the new valve position is less than the break point position. If the new valve position is less than the break point position, the controller, at step 48, can set the First_Segment Flag to false. Otherwise, the controller can leave the First_Segment Flag as true. Using the previous example, the new valve position is 19 units and the break point position is 28 units (from FIG. 2A), so the First_Segment Flag will be changed to false. The controller can then exit the routine of FIG. 2C.

If the end-of-dispense flag is still set after a particular iteration, the controller can again enter the routine of FIG. 2C. The controller can continue iterating through the process of FIG. 2C while the end-of-dispense flag is set. In the next iteration, the range calculated at step 37 will be the new valve position calculated at step 44 of the previous iteration minus the endpoint (e.g., 19–10 or 9, in the previous example). In this case the new range will equal the value change determined at step 40 or step 42 of the previous iteration.

It should be noted that as the controller iterates through the process of mode 1 according to the embodiment of FIG. 2C, the valve position will approach the end point. If configured to iterate enough times, the difference between the valve position and endpoint can become so small that it can not be detected within the resolution of the controller. Therefore, the controller can continue iterating through the process of mode 1 until the difference between the new valve position calculated at step 44 and the end point is below a particular value, and when the difference is below the predetermined value, can generate a flow control signal of sufficient magnitude to ensure that the valve is closed.

Figure 2D:
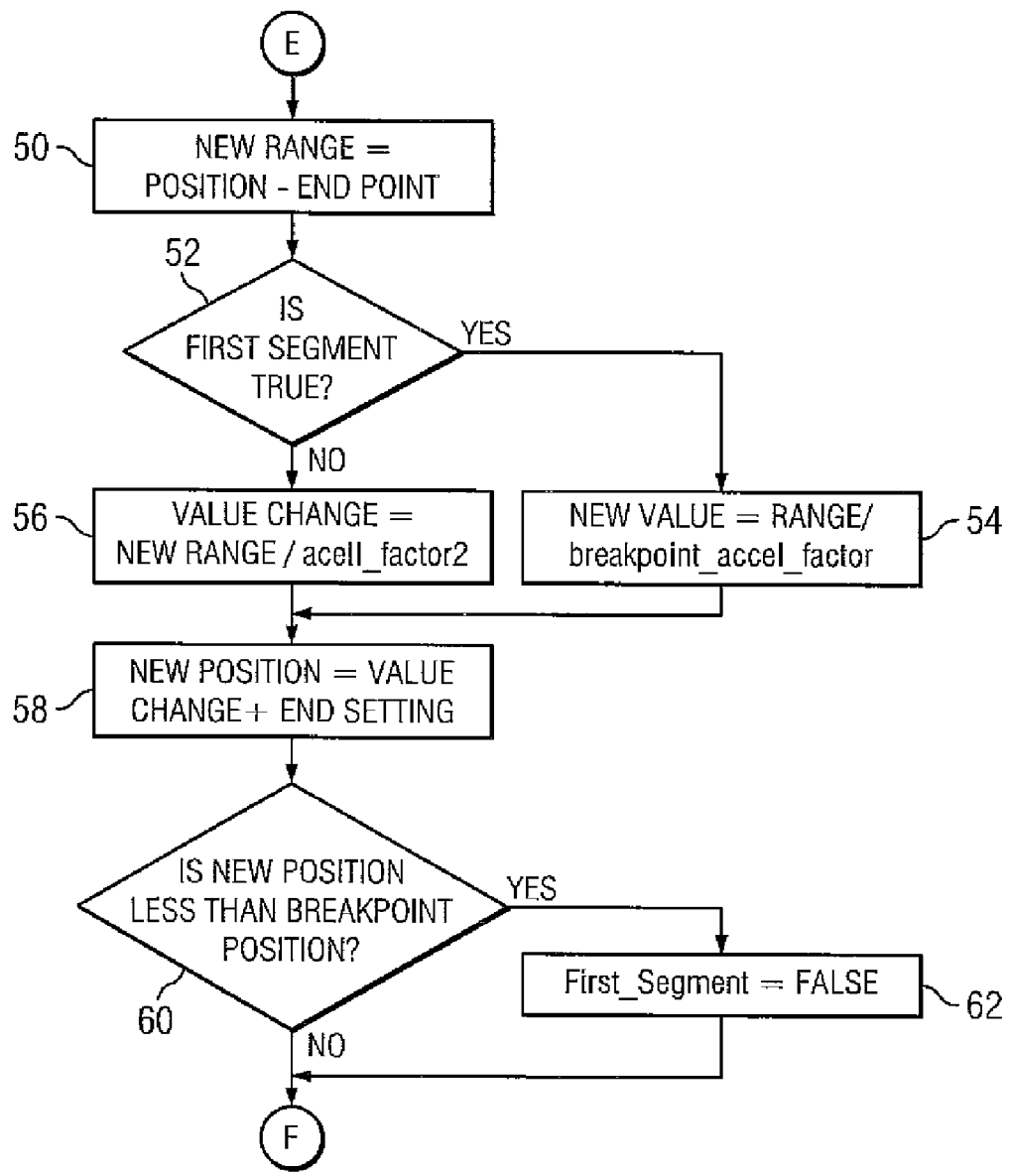
FIG. 2D illustrates another embodiment of a method for closing a fluid control valve.

FIG. 2D is a flow diagram illustrating one embodiment of the operation of the controller under a second mode of operation (e.g., mode 2 from FIG. 2B). In mode 2, the controller works in a similar manner as when the controller is in mode 1 except that in mode 2 the first acceleration factor is set such that flow control signal will cause the fluid control valve to close as quickly as possible until the break point is reached. After the break point is reached, the controller can generate the flow control signal according to a second acceleration factor such that the fluid control valve will close more slowly.

In the embodiment of FIG. 2D, the controller, at step 50, can determine a remaining range of closure. If it is the first iteration, the remaining range will be the valve position determined at step 32 of FIG. 2A minus the end position of the valve. Additionally, the controller, at step 52, can determine if the First_Segment Flag is set to true. If the First_Segment Flag is set to true, the controller can generate the flow control signal such that the fluid control valve will close as quickly as possible. Accordingly, the controller, at step 54, can determine a value change (i.e., the difference between the valve position at the end of the iteration and the end point) for a particular iteration based on the control valve closing as quickly as possible. If, conversely, the First_Segment Flag is false, the controller can generate the flow control signal based on the second acceleration factor. In this case, the value change will be the remaining close range divided by the second acceleration factor (step 56).

The controller, at step 58, can then determine the new position of the valve, which can equal the valve end point position plus the value change determined at step 54 or step 56. At step 60, the controller can determine if the new position of the valve is less than the break point position and, if so, can set the First_Segment Flag to false (step 62). Otherwise, the controller can leave the First_Segment Flag as true. The controller can then exit the routine of FIG. 2D.

If the end-of-dispense flag is still set after a particular iteration, the controller can again enter the routine of FIG. 2D. The controller can continue iterating through the process of FIG. 2D while the end-of-dispense flag is set until the difference between the new valve position determined at step 58 and the end position is below a particular value.

Figure 2E:
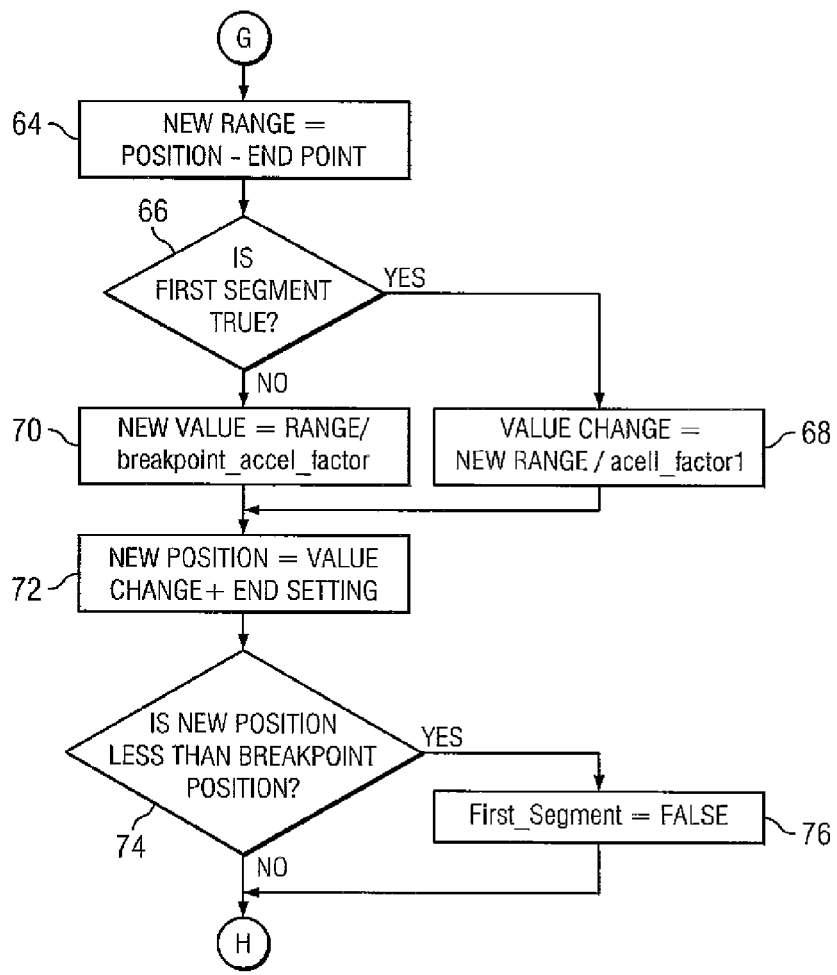
FIG. 2E illustrates yet another embodiment of a method for closing a fluid control valve.

FIG. 2E is a flow diagram illustrating one embodiment of the operation of the controller under a third mode of operation (e.g., mode 3 from FIG. 2B). In mode 3, the controller works in a similar manner as when the controller is in mode 2, except that the controller will generate the flow control signal to close the fluid control valve according to a first acceleration factor for a first segment of the close range and will generate the flow control signal to close the valve as quickly as possible over a second segment of the close range.

In the embodiment of FIG. 2E, the controller, at step 64 can determine a remaining range of closure. If it is the first iteration, the remaining range will be the valve position determined at step 32 of FIG. 2A minus the end position of the valve. Additionally, the controller, at step 66, can determine if the First_Segment Flag is set to true. If the First_Segment Flag is set to true, the controller can generate the flow control signal according to a first acceleration factor. In this case, the value change will be the remaining close range from step 64 divided by the first acceleration factor (step 68). If, however, the First_Segment Flag is false, the controller can generate the flow control signal based on the second acceleration factor that causes the fluid control valve to close as quickly as possible. The controller, at step 70, can therefore determine a value change (i.e., the difference between the valve position at the end of the iteration and the end point) for a particular iteration in which the First_Segment Flag is false based on the control valve closing as quickly as possible.

The controller, at step 72, can then determine the new position of the valve, which can equal the valve end point position plus the value change determined at step 68 or step 70. At step 74, the controller can determine if the new position of the valve is less than the break point position and, if so, can set the First_Segment Flag to false (step 76). Otherwise, the controller can leave the First_Segment Flag as true. The controller can then exit the routine of FIG. 2D.

If the end-of-dispense flag is still set after a particular iteration, the controller can again enter the routine of FIG. 2D. The controller can continue iterating through the process of FIG. 2D while the end-of-dispense flag is set until the difference between the new valve position determined at step 58 and the end position is below a particular value.

In the fourth mode of operation (e.g., mode 4 from FIG. 2C), the controller can generate a fluid control signal to close the fluid control valve as quickly as possible or according to a particular acceleration factor. Thus, the fluid control valve can "slam shut" or close according to a particular acceleration factor.

Figure 2F:
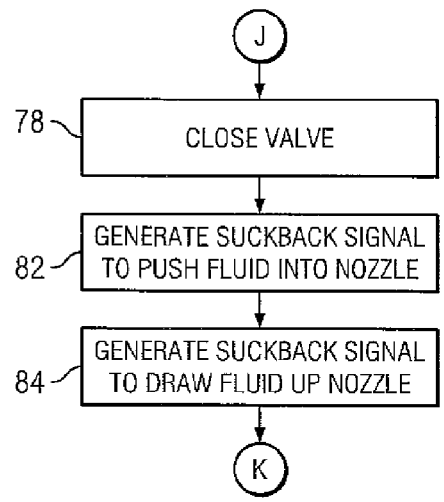
FIG. 2F illustrates one embodiment of a method of controlling a suckback valve.
Figure 2G:
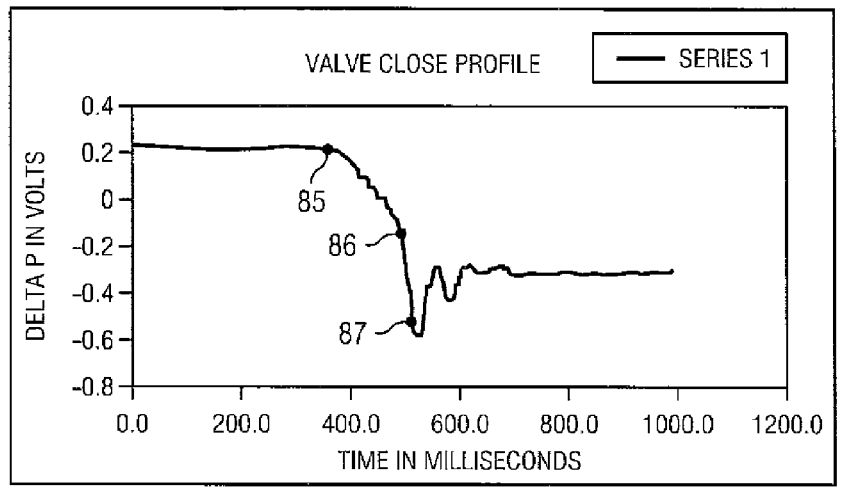
FIG. 2G is a valve profile graph for a valve closing according to one embodiment of the present invention.

FIG. 2F is a flow diagram illustrating one embodiment of the operation of the controller under a fifth mode of operation (e.g., mode 5 from FIG. 2B). In mode 5, the controller, according to one embodiment of the present invention, can generate a flow control signal to cause the fluid control valve to close as quickly as possible (step 78). Once the fluid control valve has closed, whether done as quickly as possible according to step 78 or done according to multiple acceleration factors, the controller can generate a suckback control signal to cause the suckback valve to push fluid into the dispense nozzle (step 82). The controller can be empirically calibrated for a particular system set up and fluid to generate the suckback control signal such that the suckback will push the fluid to the end of the nozzle, without dispensing the fluid from the nozzle. The controller can then generate the suckback control signal to cause the suckback valve to draw the fluid back into the nozzle according to any suckback control scheme known in the art (step 84). The controller can be empirically calibrated to draw the fluid back into the nozzle slowly enough to prevent residual droplets forming in the nozzle. This calibration can be based, for example, on the dispense process setup, nozzle configuration and fluid being dispensed.

It should be noted that although FIGS. 2A-2F were discussed in terms of separate software routines, the processes of FIGS. 2A-2F can be implemented as portions of the same program, modules of a program, objects or according to any suitable programming language and architecture. It should be further noted that the controller can be configured to operate according to each of the modes, all of the modes or any combination of the modes discussed in conjunction with FIGS. 2A-2F. Moreover, FIGS. 2A-2F are provided by way of example and are not intended to limit the manner in which the controller can generate the flow control signal according to multiple acceleration factors.

While the close rate parameter in the examples of FIG. 2C-2D is an acceleration factor that causes the rate of change of closing (i.e., the close rate acceleration) to change at different rates over the first segment and second segment of the close range, embodiments of the present invention can also be configured such that the close rate parameter corresponds to a particular close rate. In this case, the fluid control valve can close according to a first close rate for a first segment of the close range and close with a second close rate for a second segment of the close rate. Additionally, the close rate parameter can correspond to a particular rate of change in close rate (i.e., close rate acceleration), such that the valve can close with a first close rate acceleration for a first segment of the close rate and close with a second close rate acceleration for a second segment of the close rate.

FIG. 2G illustrates a valve close profile for an example valve closing according to one embodiment of the present invention. The x axis represents time and the y axis represents the pressure differential (measured in volts) detected by one or more pressure sensors. As the flow rate of a fluid is proportional to the pressure difference, the pressure difference indicates the amount the fluid control valve has closed.

In the example of FIG. 2G, the controller can determine, at point 85, that a dispense process should end. For a first segment of the valve close range, (e.g., until break point 86), the controller can generate a flow control signal to close the flow control valve according to a first close rate parameter, resulting in the decrease in flow rate represented in the graph between point 85 and 86. For a second segment of the close range (e.g., after the valve has closed to or beyond break point 86), the controller can generate the flow control signal based on a second close rate parameter. When the valve has closed (represented at point 87), the controller can generate the flow control signal required to keep the flow control valve closed.

Thus, embodiments of the present invention can generate a flow control signal according to various close rate parameters to cause a fluid control valve (such as that in fluid control device 12 of FIG. 1). The controller can generate the flow control signal based on a first close rate parameter for a first segment of the close range (e.g., for a first range of closure of the fluid control valve) to cause a fluid control valve to close with a first close rate, close rate acceleration, or rate of change in close rate acceleration and can further generate the flow control signal based on a second close rate parameter for a second segment of the close range to cause the fluid control valve to close with a second close rate, close rate acceleration, or change close rate acceleration. The controller can switch between basing the flow control signal on the first close rate parameter and the second close rate parameter at a break point.

It should be noted that the first close rate parameter, second close rate parameter and break point can be defined for a particular dispense process and system. These parameters can vary according to the fluid properties, of the fluid being dispensed, particularly the surface tension and viscosity, the dispense system configuration, the rate at which the fluid will be dispensed and the application for which the dispense process is being used. Empirical testing and calibration can be used to determine the first close rate parameter, second close rate parameter and break point that reduce the potential for excess fluid being deposited on the wafer for the particular dispense process.

It should be further noted that embodiments of the present invention can also apply additional close rate parameters. For example, a controller can execute computer instructions to generate a fluid control signal based on a first close rate parameter for a first segment of the fluid control valve close range, generate the fluid control signal based on a second close rate parameter for a second segment of the close range of the fluid control valve and generate the fluid control signal based on a third close rate parameter for a third segment of the fluid control range and so on. The controller can automatically switch between generating the fluid control signal on the various close rate parameters at one or more predefined breakpoints. Thus, the controller can generate an arbitrarily complex closing profile for the fluid control valve.

Additionally, the controller can cause the suckback valve to assist in the end of dispense control to determine the fluid height at the end of the dispense process. The controller can be configured to cause the suckback valve to begin moving fluid at a point defined sometime during the dispense (e.g., from 0% to 50% of dispense time prior to the end of dispense or other time). The moving fluid can push fluid to the end of the nozzle or pull fluid up into the nozzle as defined by the controller configuration.

Figure 3:
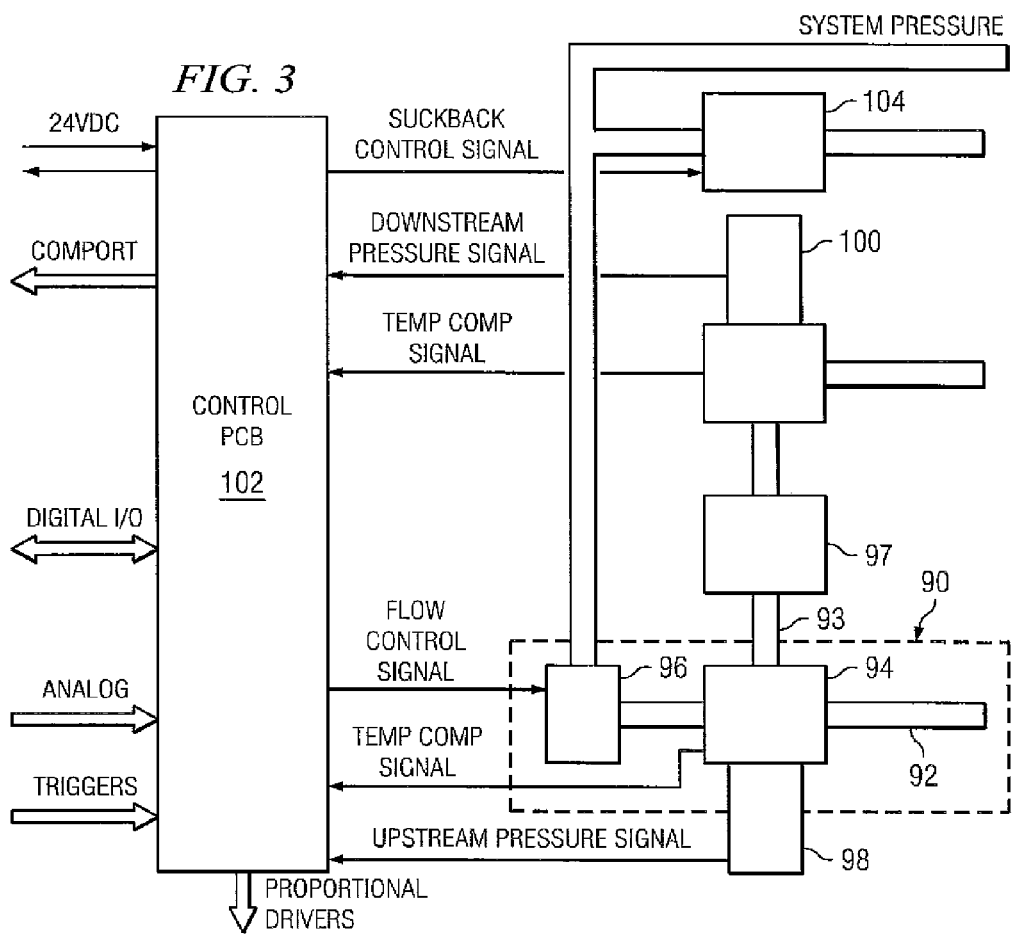
FIG. 3 is a diagrammatic representation of one embodiment of a dispense system.

FIG. 3 is a diagrammatic representation of one embodiment of a fluid control system in which embodiments of the present invention can be implemented. A fluid control device 90 is shown having a liquid inlet line 92 and a liquid outlet line 93 for ultimate dispensing of the liquid to a point of use, such as a substrate which can be a wafer (not shown). Fluid control device 90 can include a fluid control valve 94, such as that described in the Liquid Flow Control Application, and a pneumatic proportional control valve 96, pneumatically connected to fluid control valve 94. The liquid outlet line 93 is in fluid communication with a frictional flow element 97, such that all of the liquid exiting the fluid control device 90 enters the frictional flow element 97. A first pressure sensor 98 such as a pressure transducer, which can be integral with the fluid control device 90 housing, is positioned at or near the inlet of the frictional flow element 97 (such as at or near the outlet of the fluid control valve 94) to sense a first pressure, and a second pressure sensor 100 such as a pressure transducer is positioned at or near the outlet of the frictional flow element 97 to sense a second pressure. Alternatively, a single differential pressure sensing device could be used. The portion of the pressure sensor(s) that contact the fluid is preferably made of an inert material (with respect to the fluid used in the application) such as sapphire, or is coated with a material compatible with the fluids it contacts, such as perfluoropolymer. The sensors sense pressure and temperature in the fluid path, and send signals indicative of the sensed pressure and temperature to a controller.

Each pressure sensor 98, 100 (or a single differential pressure sensing device) is in communication with a controller 102, such as a controller having proportional, integral and derivative (PID) feedback components. As each sensor 98 and 100 samples the pressure and temperature in its respective fluid line, it sends the sampled data to the controller 102. The controller 102 can compare the values and calculate a pressure drop across the frictional flow element 97. A signal from the controller 102 based on that pressure drop is sent to the pneumatic proportional control valve 96, which modulates the fluid control valve 94 accordingly, preferably after compensating for temperature, and/or viscosity and/or density.

More specifically, the system preferably is calibrated for the fluid being dispensed using a suitable fluid such as deionized water or isopropyl alcohol as a fluid standard. For example, once the system is calibrated to the standard, preferably experimentally, the characteristics of the fluid to be dispensed are inputted or determined automatically, such as viscosity and density, so that the fluid to be dispensed can be compared to the standard and a relationship established. Based upon this relationship, the measured pressure drop (as optionally corrected for temperature, viscosity, etc.) across the frictional flow element, is correlated to a flow rate, compared to the desired or target flow rate, and the fluid control valve 94 is modulated accordingly by the pneumatic proportional control valve 96.

A suckback device, that preferably includes programmable proportional valve 104, is in communication with a proportional control valve (which can be the same or different from pneumatic proportional control valve 96) and is controlled by the controller (or by a different controller). It is actuated when fluid dispense is stopped or in transition, pushing fluid into the dispense nozzle, thereby reducing or eliminating the formation of undesirable droplets that could fall onto the wafer when the fluid dispense operation is interrupted, and drawing the fluid back from the dispense nozzle to minimize or prevent its exposure to atmosphere. The rate and extent of the suckback valve 104 opening and closing is controlled accordingly. Preferably the suckback valve 104 is located downstream of the fluid control valve 94.

By controlling the pressure to the fluid control valve 94 by, for example, controlling pneumatic proportional control valve 96, various fluid dispensing parameters can be controlled. For example, where the liquid to be dispensed is a low viscosity liquid, the fluid control valve 94 can be carefully modulated using pressure to ensure uniform dispensing of the liquid.

Additionally, the rate at which fluid control valve 94 closes can be regulated. By changing the rate of closure of fluid control valve 94, drops of excess fluid at the end of the dispense process can be reduced or prevented. Once the pressure-to-volume relationship of the particular fluid control valve 94 being used is characterized, unlimited flexibility can be obtained.

The embodiment illustrated in FIG. 3 is simply one embodiment of a dispense system in which embodiments of the present invention can be implemented. The fluid control device of FIG. 3 (e.g., fluid control valve 94 and proportional pneumatic control valve 96) can be responsive to a fluid control signal to close the fluid flow path. The fluid control signal can be based on one or more close rate parameters, as discussed in conjunction with FIGS. 2A-2E. Additionally, the suckback control device can be responsive to a suckback control signal to push fluid into a dispense nozzle or draw fluid into the nozzle as described in conjunction with FIG. 2F.

Figure 4:
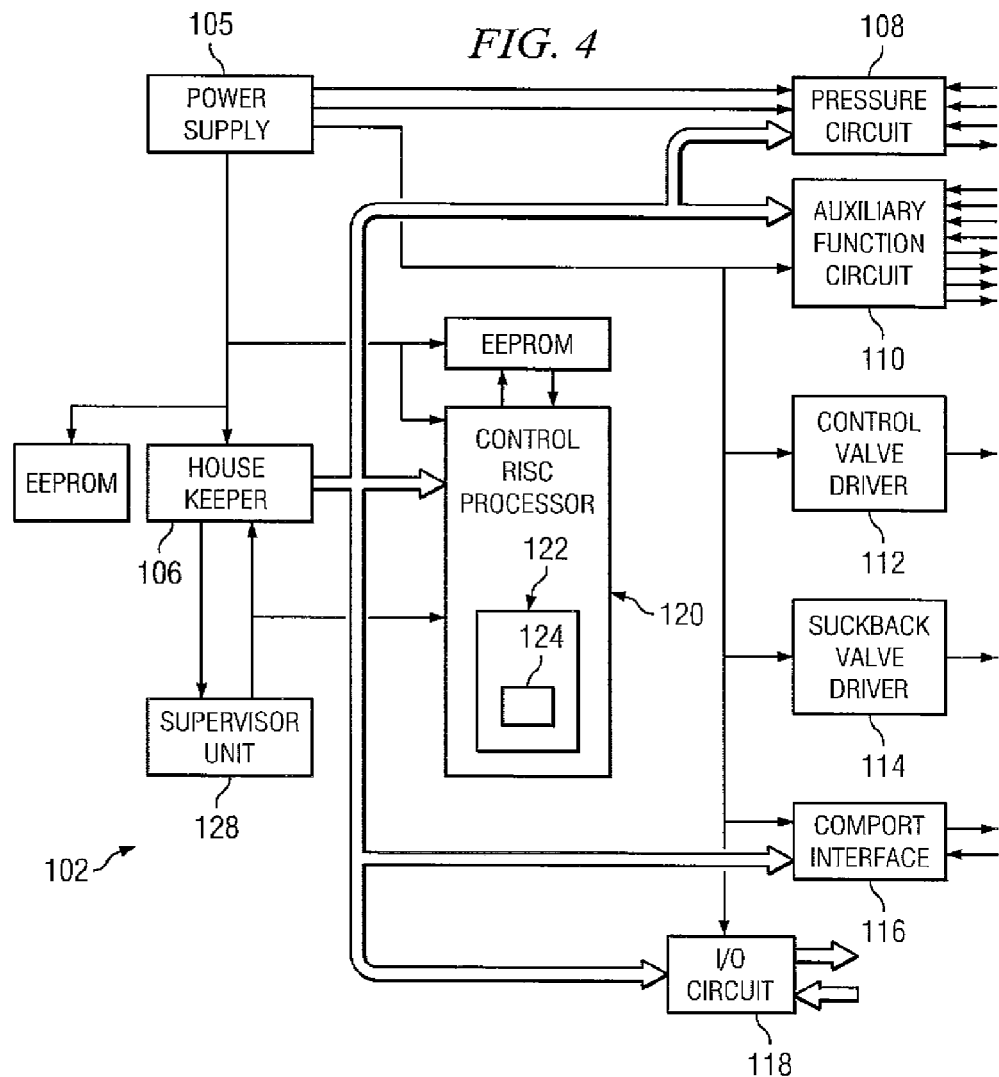
FIG. 4 is a diagrammatic representation of one embodiment of controller.

FIG. 4 is a block diagram that illustrates one embodiment of a controller 102 that can generate a fluid control signal to throttle/open a pneumatic proportional control valve (e.g., pneumatic proportional control valve 96 of FIG. 3), which will in turn cause fluid control valve (e.g., fluid control valve 94 of FIG. 3) to open or close. Controller 102 can include a power supply 105, a house keeping processor 106, a pressure circuit 108, an auxiliary function circuit 110, a control valve driver 112, a suckback valve driver 114, a comport interface 116, an I/O circuit 118 and a control processor 120. Control processor 120 can include flash memory 122 that can store a set of computer readable instructions 124 that are executable to generate a flow control signal based on pressure signals received from the pressure circuit. The flow control signal can be generated according to any scheme for generating valve control signals known or developed in the art. Various components of controller 102 can communicate through data bus 126. A supervisor unit 128 can monitor various functions of controller 102. It should be noted that while computer readable instructions 124 are shown as software at a single memory, computer readable instructions can be implemented as software, firmware, hardware instructions or in any suitable programming manner known in the art. Additionally, the instructions can be distributed among multiple memories and can be executable by multiple processors.

In operation, power supply 105 can provide power to the various components of controller 102. Pressure circuit 108 can read pressures from upstream and downstream pressure sensors and provide an upstream and downstream pressure signal to control processor 120. Controller processor 120 can calculate a flow control signal based on the pressure signals received from pressure circuit 108 and control valve driver 112, in turn, can generate a drive signal based on the flow control signal. The generation of the flow control signal can occur according to the methodology discussed in the Liquid Flow Controller Application or according to any control signal generation scheme known in the art. At the end of the dispense process, the controller can generate the flow control signal based on various close rate parameters as discussed in conjunction with FIGS. 2A-2E. Additionally, the controller can generate a suckback control signal as discussed in conjunction with FIG. 2F. The methodologies for generating the flow control signal and the suckback signal can be implemented as software, or other computer readable instructions (e.g., instructions 124), stored on a computer readable memory (e.g., RAM, ROM, FLASH, magnetic storage or other computer readable memory known in the art) accessible by control processor 120.

With respect to other components of controller 102, house keeping processor 106 can be a general purpose processor that performs a variety of functions including directing communications with other devices or any other programmable function, known in the art. One example of general purpose processor is an Intel 8051 processor. Auxiliary function circuit 110 can interface with other devices. Suckback valve driver 114 can control a suckback valve (e.g., suckback valve 104 of FIG. 1). Comport interface 116 and I/O circuit 118 can provide various means by which to communicate data to/from controller 102. Additional components can include a supervisor unit 2720 that can perform device monitoring functions known in the art, various eeproms or other memories, expansions ports or other computer components known in the art.

Figure 5:
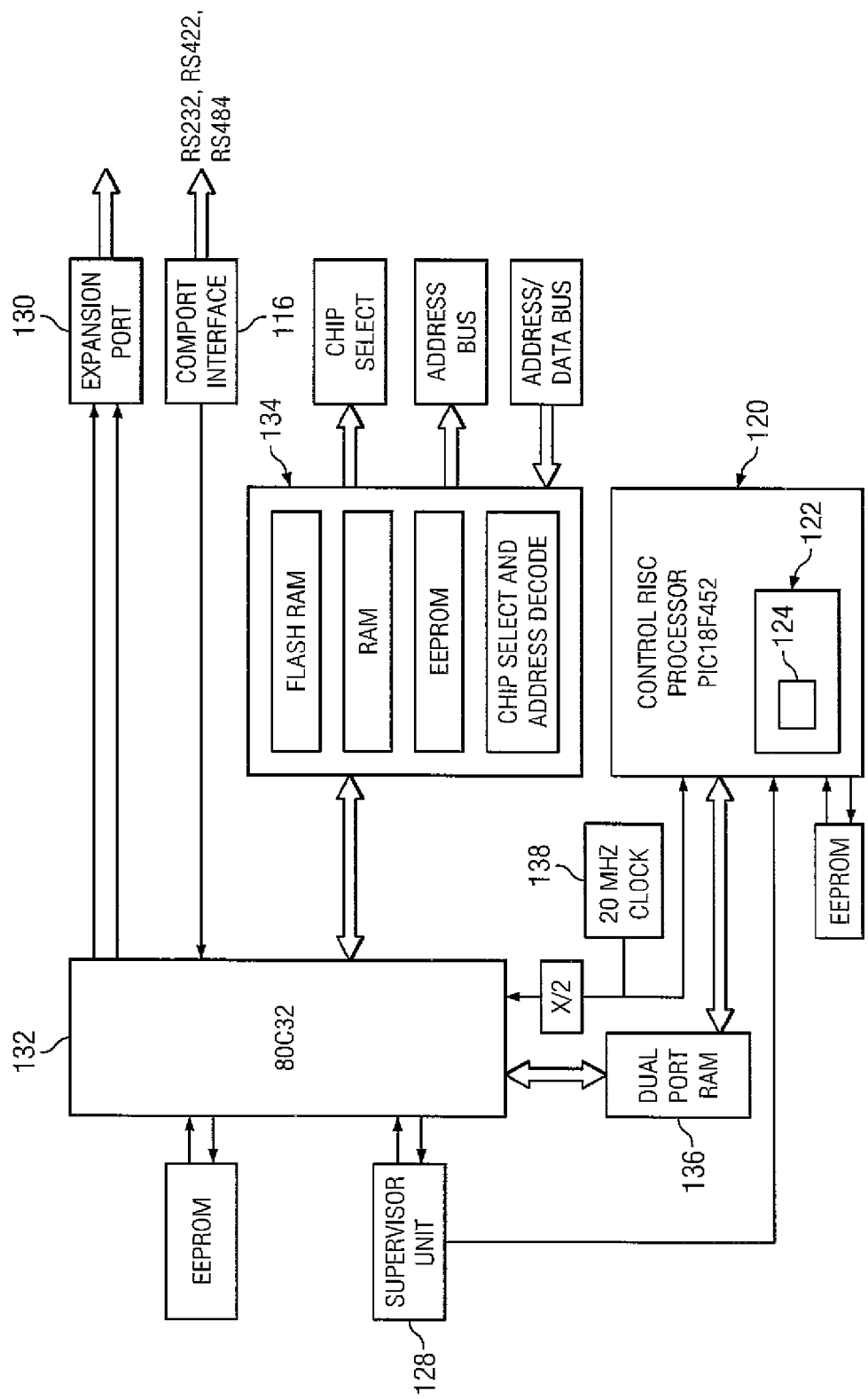
FIG. 5 is a diagrammatic representation of one embodiment of a control circuit for a controller.

FIG. 5 is a block diagram that illustrates one embodiment of the control logic circuit of controller 102 that can generate a valve drive signal to throttle/open a proportional control valve. Several of the components of controller 102 are illustrated including control processor 120, comport interface 116 and supervisor unit 128. Additionally, an expansion port 130 is shown. Expansion port 130 can be used to add daughter boards to expand the functionality of controller 102.

In the embodiment of FIG. 5, the functionality of house keeping processor 106 is split into three portions: processing portion 132, memory device portion 134 and dual port RAM portion 136. Memory device portion 134 can include various memories including Flash Memory, RAM, EEPROM and other computer readable memories known in the art. One advantage of providing Flash Memory to house keeping processor 106 is that it allows easy downloads of firmware updates via, for example, comport interface 116. Additionally memory device portion 134 can include functionality for chip selections and address decoding. It should be noted that each of memory device portion 134, dual port RAM portion 136 and processing portion 132 can be embodied in a single processor. Control processor 120 and processing portion 132 of the house keeping processor can share data, in one embodiment of the present invention, through mutual access to dual port RAM portion 136. Control processor 120 and processing portion 132 of the house keeping processor can be driven by a single system clock 138 (e.g., a 20 MHz clock) or different system clocks.

Control processor 120 can include flash memory 122 that can store a set of computer executable instructions 124 that are executable to generate a flow control signal based on pressure signals received from the pressure circuit according to the control scheme described in the Liquid Flow Controller Application. Additionally, control processor 120 can execute instructions 124 to generate a flow control signal according to various close rate parameters to cause a fluid control valve (such as fluid control valve 94 of FIG. 3) to close. The controller can generate the flow control signal based on a first close rate parameter for a first segment of the close range and can further generate the flow control signal to cause the fluid control valve to close according to a second close rate parameter for a second segment of the close range. The controller can switch between basing the flow control signal on the first close rate parameter and the second close rate parameter at a break point. By calibrating the close rate parameters for a particular fluid and dispense systems, embodiments of the present invention can prevent excess drops of fluid from falling onto a wafer after the dispense process has ended.

Control processor 120 can also execute instructions 124 to generate a suckback control signal configured to cause a suckback valve to push fluid to the end of a dispense nozzle and then draw the fluid back into the nozzle. As the fluid is pushed to the end of the dispense nozzle, the fluid can absorb fluid droplets remaining in the nozzle. The fluid can then be drawn back into the nozzle to prevent air flow around the nozzle from causing crystallization of the fluid. The fluid can be drawn back slowly enough to prevent droplets of excess fluid from remaining in the nozzle.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed in the following claims.

What is claimed is:

1. A computer program product comprising a non-transitory computer readable storage medium storing a set of computer instructions, executable by a computer processor, wherein the set of computer instructions comprise instructions executable to:

generate a flow control signal to close a fluid control valve based on a first close rate parameter for a first segment of a close range;

generate a flow control signal to close the fluid control valve based on a second close rate parameter for a second segment of the close range;

determine that the fluid control valve has closed;

generate a suckback control signal configured to cause a suckback valve to push a fluid to an end of a nozzle in response to the determination that the fluid control valve has closed; and generate a suckback control signal configured to cause the suckback valve to draw the fluid into the nozzle after the fluid has reached the end of the nozzle;

wherein the first close rate parameter is a first acceleration factor corresponding to a first rate of change in a close rate acceleration and the second close rate parameter corresponds to a second rate of change in the close rate acceleration.

2. The computer program product of claim 1, wherein the first close rate parameter corresponds to shutting the fluid control valve as quickly as possible.

3. The computer program product of claim 1, wherein the second close rate parameter corresponds to shutting the fluid control valve as quickly as possible.

4. The computer program product of claim 1, wherein the computer instructions further comprise instructions executable to generate the flow control signal based on at least one additional close rate parameter for at least one additional segment of the close range.

5. A computer program product comprising a non-transitory computer readable medium storing a set of computer instructions, wherein the set of computer instructions comprise instructions executable to:

generate a flow control signal to close a fluid control valve based on a first close rate parameter for a first segment of a close range;

generate a flow control signal to close the fluid control valve based on a second close rate parameter for a second segment of the close range;

determine that the fluid control valve has closed;

generate a suckback control signal configured to cause a suckback valve to push a fluid to an end of a nozzle; and generate a suckback control signal configured to cause the suckback valve to draw the fluid into the nozzle after the fluid has reached the end of the nozzle;

wherein the first close rate parameter is a first acceleration factor corresponding to a first rate of change in a close rate acceleration and the second close rate parameter corresponds to a second rate of change in the close rate acceleration.

6. The computer program product of claim 5, wherein the first close rate parameter corresponds to shutting the fluid control valve as quickly as possible.

7. The computer program product of claim 5, wherein the second close rate parameter corresponds to shutting the fluid control valve as quickly as possible.

8. The computer program product of claim 5, wherein in the computer instructions further comprise instructions executable to generate the flow control signal based on at least one additional close rate parameter for at least one additional segment of the close range.

9. A system for regulating fluid flow comprising:

a fluid control valve;

a suckback valve downstream of the fluid control valve;

a nozzle downstream of the suckback valve;

a controller further comprising:

a processor;

a computer readable memory;

a set of computer instructions stored on the computer readable memory, the computer instructions comprising instructions executable by the processor to:

generate a flow control signal to close the fluid control valve based on a first close rate parameter for a first segment of a close range;

generate a flow control signal to close the fluid control valve based on a second close rate parameter for a second segment of the close range;

determine that the fluid control valve has closed;

generate a suckback control signal configured to cause the suckback valve to push a fluid to an end of the nozzle; and generate a suckback control signal configured to cause the suckback valve to draw the fluid into the nozzle after the fluid has reached the end of the nozzle, wherein the first close rate parameter is a first acceleration factor corresponding to a first rate of change in a close rate acceleration and the second close rate parameter corresponds to a second rate of change in the close rate acceleration.

10. The system of claim 9, wherein the computer instructions further comprise instructions executable to switch from generating the flow control signal according to the first close rate parameter to generating the flow control signal based on the second close rate parameter based on a break point.

11. The system of claim 9, wherein in the computer instructions further comprise instructions executable to generate the flow control signal based on at least one additional close rate parameter for at least one additional segment of the close range.

12. The system of claim 9, wherein the first close rate parameter corresponds to shutting the fluid control valve as quickly as possible.

13. The system of claim 9, wherein the second close rate parameter corresponds to shutting the fluid control valve as quickly as possible.

* * * * *

UNITED STATES PATENT AND TRADEMARK OFFICE
CERTIFICATE OF CORRECTION

| | | |
|---|---|---|
| PATENT NO. | : 8,082,066 B2 | Page 1 of 1 |
| APPLICATION NO. | : 11/937931 | |
| DATED | : December 20, 2011 | |
| INVENTOR(S) | : Laverdiere et al. | |

It is certified that error appears in the above-identified patent and that said Letters Patent is hereby corrected as shown below:

Col. 4, line 67, replace "engage" with --engaged--

Col. 5, line 18, delete "to"

Col. 5, line 26, insert --16-- after --valve--

Signed and Sealed this
Twenty-seventh Day of March, 2012

David J. Kappos
*Director of the United States Patent and Trademark Office*